United States Patent [19]

Hyun et al.

[11] Patent Number: 5,668,062
[45] Date of Patent: Sep. 16, 1997

[54] METHOD FOR PROCESSING SEMICONDUCTOR WAFER WITH REDUCED PARTICLE CONTAMINATION DURING SAW

[75] Inventors: Dae-Jin Hyun, Dallas; James L. Connor, Rowlett, both of Tex.

[73] Assignee: Texas Instruments Incorporated, Dallas, Tex.

[21] Appl. No.: 518,434

[22] Filed: Aug. 23, 1995

[51] Int. Cl.$^6$ .................................................. H01L 21/00
[52] U.S. Cl. .................................................. 438/462
[58] Field of Search .................................................. 437/226

[56] References Cited

U.S. PATENT DOCUMENTS

| | | | |
|---|---|---|---|
| 3,537,169 | 11/1970 | Eigeman et al. | 437/226 |
| 3,677,875 | 7/1972 | Althouse | 437/226 |
| 4,455,739 | 6/1984 | Hynecek | 437/226 |
| 4,542,397 | 9/1985 | Biegelsen et al. | 437/226 |
| 5,061,049 | 10/1991 | Hornbeck | 359/224 |
| 5,079,544 | 1/1992 | DeMond et al. | 340/701 |
| 5,105,369 | 4/1992 | Nelson | 364/525 |
| 5,182,233 | 1/1993 | Inoue | 437/226 |
| 5,278,652 | 1/1994 | Urbanus et al. | 358/160 |
| 5,341,024 | 8/1994 | Rosotker | 437/226 |
| 5,393,706 | 2/1995 | Mignardi et al. | 437/226 |
| 5,435,876 | 7/1995 | Alfaro et al. | 156/247 |
| 5,501,104 | 3/1996 | Ikeda et al. | 437/226 |
| 5,527,744 | 6/1996 | Mignardi et al. | 437/226 |
| 5,534,102 | 7/1996 | Kadono et al. | 437/226 |

*Primary Examiner*—R. Bruce Breneman
*Assistant Examiner*—Luz Alejandro
*Attorney, Agent, or Firm*—Robert C. Klinger; James C. Kesterson; Richard L. Donaldson

[57] ABSTRACT

A method of processing a semiconductor wafer (12) to form micromechanical devices. Extended scribe lines (20) are provided from centrally located integrated circuit scribe lines (16) to provide a saw street that extends to the perimeter of the wafer. Micromechanical devices (14), including those of the DMD type, can be fabricated without a layer of protective oxide while reducing the generation of conductive particles during the wafer saw process which could otherwise degrade the operation of the micromechanical devices having movable elements. The extended scribe lines (20) are fabricated at the same time that the conventional scribe lines (16) are formed about the integrated circuits (14).

8 Claims, 1 Drawing Sheet

METHOD FOR PROCESSING SEMICONDUCTOR WAFER WITH REDUCED PARTICLE CONTAMINATION DURING SAW

FIELD OF THE INVENTION

The present invention is generally related to a method of processing semiconductor wafers, and more particularly, to a method for processing semiconductor wafers to produce micromechanical devices (MEMs), these MEMs being susceptible to degradation by particles generated during wafer saw or cut.

BACKGROUND OF THE INVENTION

The processing and fabrication of conventional integrated circuits from semiconductor wafers is well known in the art. Typically, a semiconductor wafer which may comprise silicon is repeatedly patterned and processed to create a plurality of integrated circuits from a single wafer. Each of these integrated circuits is separated from one another by a scribe which encompasses each of the integrated circuits and which is formed during the patterning process. After completion of the circuit fabrication process, the wafer is sawed or cut along these scribe lines to produce individual circuit dies. The dies may later be encapsulated in plastic, ceramic or other packages which include circuit leads that are connected to the die by bond wires.

In conventional semiconductor processing, the fully processed semiconductor wafer is coated with a protective layer of oxide prior to the wafer being sawed into individual dies. Thus, each of the individual dies is protected from damage which may otherwise be caused by the debris particles generated during the saw process.

The scribe lines serve to seal each integrated circuit from the next so that no ion contamination is generated from the edges of the integrated circuit after a wafer saw break. The scribe lines are also used to provide alignment of reticles used during the repeated integrated circuit patterning process. The scribe lines can also serve to produce test structures within the scribe line, for instance, resistors or transistors, to provide a control monitor during processing. For instance, the resistance of a strip of the scribe can be tested to ascertain the resistance of an implanted material that may serve in the circuit section as the moat for transistor regions in the wafer. Conventionally, these scribe lines are only formed about the perimeter of the centrally located integrated circuits which are fabricated upon the wafer.

A recent innovation of Texas Instruments Incorporated of Dallas Texas, is the digital micromirror device or the deformable mirror device (collectively DMD). The DMD is an electro/mechanical/optical SLM suitable for use in displays, projectors and hard copy printers. The DMD is a monolithic single-chip integrated circuit SLM, comprised of a high density array of 16 micron square movable micromirrors on 17 micron centers. These mirrors are fabricated over address circuitry including an array of SRAM cells and address electrodes. Each mirror forms one pixel of the DMD array and is bistable, that is to say, stable in one of two positions, wherein a source of light directed upon the mirror array will be reflected in one of two directions. In one stable "on" mirror position, incident light to that mirror will be reflected to a projector lens and focused on a display screen or a photosensitive element of a printer. In the other "off" mirror position, light directed on the mirror will be deflected to a light absorber. Each mirror of the array is individually controlled to either direct incident light into the projector lens, or to the light absorber. The projector lens ultimately focuses and magnifies the modulated light from the pixel mirrors onto a display screen and produce an image in the case of a display. If each pixel mirror of the DMD array is in the "on" position, the displayed image will be an array of bright pixels.

For a more detailed discussion of the DMD device and uses, cross reference is made to U.S. Pat. No. 5,061,049 to Hornbeck, entitled "Spatial Light Modulator and Method"; U.S. Pat. No. 5,079,544 to DeMond, et al, entitled "Standard Independent Digitized Video System"; and U.S. Pat. No. 5,105,369 to Nelson, entitled "Printing System Exposure Module Alignment Method and Apparatus of Manufacture", each patent being assigned to the same assignee of the present invention and the teachings of each are incorporated herein by reference. Gray scale of the pixels forming the image is achieved by pulse-width modulation techniques of the mirrors, such as that described in U.S. Pat. No. 5,278, 652, entitled "DMD Architecture and Timing for Use in a Pulse-Width Modulated Display System", assigned to the same assignee of the present invention, and the teachings of which are incorporated herein by reference.

The individual mirrors of the DMD mirror array are easily susceptible to damage from debris including particles generated during the wafer saw and break process. Because the DMD is a micromechanical device with movable pixel mirrors, the DMDs fabricated upon a wafer may not be conveniently covered with a protective oxide coating prior to a saw process as is conventional according to other semiconductor processing techniques. Moreover, due to the conductive address electrodes with are positioned below the conductive mirrors, a conductive particle entrapped between the mirror and address electrode could easily short the mirror to the address electrode. Thus, it is particularly important in the case of the DMD to avoid generating any particles during the wafer saw process which may degrade the performance of the mirrors.

As disclosed in commonly assigned U.S. Pat. No. 5,435, 876 entitled Grid Array Masking Tape Process, one technique to protect the wafer during sawing is to utilize a grid array masking tape over the active surface of the processed wafer. The tape adheres to the wafer along a grid extending between the formed integrated circuits and prevents debris from damaging the active surface during the sawing process. The tape is removed after the saw process and then the photoresist under the mirror layer is undercut by a plasma etch process to form wells under the mirrors.

There is a need to provide an improved method for processing semiconductor wafers to produce micromechanical devices which reduces the likelihood that conductive particles are generated during the wafer saw process or remain entrapped under the mirrors after the plasma etch process of the photoresist spacer layer. This improved method should be applicable to fabricating integrated circuits having moving elements and which can not be readily provided with a conventional protective oxide coating.

SUMMARY OF THE INVENTION

The present invention achieves technical advantages by providing scribe lines extending from the scribe lines normally fabricated about the perimeter of the integrated circuits to proximate the edge of the wafer. When the wafer is cut along the scribe lines to separate the integrated circuits into individual dies, the wafer is cut along a path free of any materials that can generate undesirable particles, such as conductive material used to fabricate the superstructure of a DMD micromechanical device. The remaining portions of the integrated circuit may have one or more layers comprised of a conductive material, i.e., metal, such as layers patterned to form conductive address electrodes and elevated mirrors. The extended scribe lines extend across the wafer from the opposing periphery thereof, thus, the saw process is always performed along a scribe line and never across any metal layer. A micromechanical integrated circuit can be fabricated with reduced conductive particle generation, including a device not suited to receive a protective oxide layer before the saw process, such as a DMD.

DETAIL DESCRIPTION OF THE PREFERRED EMBODIMENT

Figure 1:
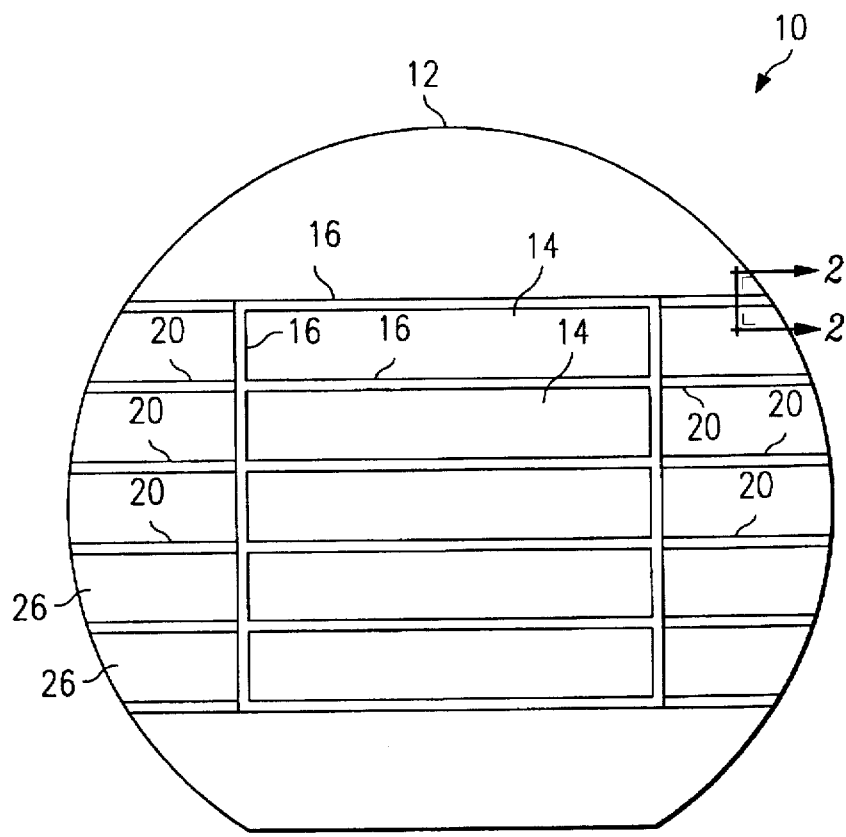
FIG. 1 is a top view of a semiconductor wafer having additional scribe lines extending from the conventional scribe lines about the periphery of fabricated integrated circuits to the periphery of the wafer, such that during a wafer saw process the cut is always made along a scribe line and never through a portion of the wafer having a layer of metal.

Referring now to FIG. 1, there is shown generally at 10 a top view of a processed semiconductor wafer 12. Wafer 12 is preferably comprised of silicon, but could also comprise of other semiconductor materials suitable for use in fabricating integrated circuits, for instance, gallium arsenide. Wafer 12 is fabricated according to well known semiconductor processing techniques to have a plurality of integrated circuits generally shown at 14. According to the preferred embodiment of the present invention, each of the integrated circuits 14 is fabricated to be a DMD micromechanical device, such as that described in the previously cross referenced commonly assigned patents, the teachings incorporated herein by reference. Encapsulating each of these DMD circuits 14 about a perimeter thereof is seen to be a rectangular scribe line generally shown at 16. Scribe lines 16 are fabricated during the semiconductor fabrication process as is well known in the art. Scribe lines 16 provide a seal for the integrated circuits 14 so that no ion contamination from the edges of the integrated circuit is possible after a wafer saw break. The scribe lines 16 can also provide alignment structure for the integrated circuit patterning process, when using multiple reticles to pattern the integrated circuits 14. Scribes 16 can also provide test structures which serve as process control monitors. For instance, portions of the scribe line can be tested for resistance to ascertain the conductivity of a deposited material, such as that used to form the moat portion of integrated circuits structures in circuit 14. A strip of the scribe line can even be fabricated to form small transistors to ascertain the functionality of transistors being fabricated in circuit 14 during a particular process step.

Still referring to FIG. 1, and according to the preferred embodiment of the present invention, extended scribe lines are provided and generally shown at 20. Scribe lines 20 extend from the centrally located scribe lines 16 to the perimeter of wafer 12, as shown. These extended scribe lines 20 are collinear with the laterally extending scribe lines 16, as shown. Scribe lines 20 and 16 together form the saw streets for which are cut along during the wafer saw process to separate the integrated circuits 14 into individual dies. These scribe lines 16 and 20 are comprised of materials that will not generate undesirable particles when cut, as shown in FIG. 2.

Figure 2:
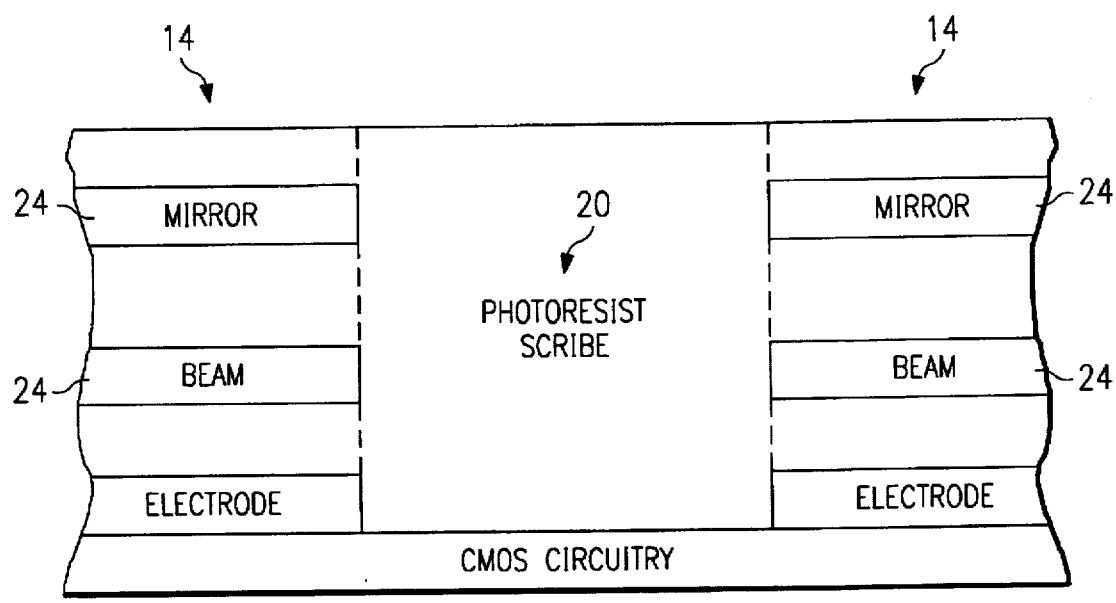
FIG. 2 is a cross section taken along lines 2—2 in FIG. 1 illustrating the cross section of the extended scribe line, the scribe line having layers comprised of a material which will not produce undesirable particles when cut, such as a photoresist.

Referring to FIG. 2, it can be seen that the scribe line 20 shown bounded by the phantom lines is fabricated at the same time that the DMD integrated circuits 14 are created. All layers comprising the scribe line 20 are a nonconductive material, preferably photoresist generally shown at 22. Thus, when a saw is used to cut along the scribe lines, the particles generated from the layers of scribe line 20 are comprised of nonconductive particles, and not of a conductive material which otherwise be formed if any of the layers were metal, i.e., the metal layers forming the superstructure of the DMD device and shown at 24.

Referring back to FIG. 1, scribe lines 20 are seen to be parallel with one another and extend collinear with the laterally extending circuit scribe lines 16. These scribe lines 20 essentially are scribe fingers extending laterally from the scribe lines 16 to the perimeter of wafer 12, as shown. During the wafer saw process, the top and bottom segments of the wafer 12 are first removed by a cutting along the upper and lower laterally extending scribe lines 16. Thereafter, the individual integrated circuits 12 are cut into individual dies by cutting across the remaining laterally extending scribe lines 16. Lastly, each of the regions shown at 26 are removed by cutting along the vertically extending scribe lines 16 at each end of the rectangular integrated circuits 14 to obtain a rectangular shaped die. These rectangular dies are subsequently mounted and packaged to have a transparent window over the mirror array, the DMD device is then being hermetically sealed.

If a layer of metal were cut, clean up processes are not necessarily sufficient to remove strands of metal dangling from the metal layers adjacent the cut. These dangling metal strands can break off and become entrapped under mirrors during a plasma etch process to undercut photoresist from under the mirrors. The present invention achieves technical advantages due to the fact that the wafer 12 is always cut along a scribe line, and never across a region having one or more layers of metal, such as the region generally shown at 26. In the case of a DMD device, an exposed metal surface of the wafer 12 is not coated with a layer of protective oxide before the wafer saw process. Again, the DMD integrated circuit is not suited to receive a protective layer of oxide since such a layer would render the movable mirrors inoperable. The remaining portions of the wafer 12, such as those generally shown at 26, have an exposed metal layer that is not etched back when the uppermost metal layer is patterned to form the address electrode structure beneath the mirrors for a DMD device. This provides very simple and clean processing since regions 26 do not need to be etched back.

In summary, the present invention derives technical advantages as a method for reducing the generation of conductive particles during the wafer saw process which could damage a micromechanical device formed on a semiconductor wafer. The present invention is particularly useful for integrated circuit devices not suited to receive a protective oxide layer before the saw cut process. By providing a scribe line extending from the circuit scribe lines to the perimeter of the wafer, a saw street is provided which has nonconductive layers everywhere the wafer is cut. Prior art semiconductor processing does not require these extended saw streets of the present invention because a protective layer of oxide can be provided over the wafer. For particular applications of processing micromechanical devices upon a wafer, such as a DMD, the present invention overcomes the limitations of utilizing no protective oxide layer and reduces the generation of conductive particles which can degrade the operation of the fabricated DMD devices.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A method of processing a semiconductor wafer, comprising the steps of:
   a) defining primary circuit scribes in said wafer to define an active circuit processing area;
   b) defining a semiconductor circuit in said active circuit processing area; and
   c) defining at least one secondary scribe in said wafer being continuous with said primary circuit scribe and extending to proximate said wafer edge, said secondary scribe extending between non-active wafer portions of said semiconductor wafer.

2. The method as specified in claim 1 further comprising the step of defining said secondary scribe to be collinear with said primary circuit scribe.

3. The method as specified in claim 1 further comprising the step of defining said primary circuit scribes to define at least one rectangular said active circuit processing area, with a plurality of said secondary scribes extending from corners of said circuit rectangular active processing area.

4. A semiconductor wafer, comprising:
   a) a primary circuit scribe in said wafer defining at least one active circuit processing area;
   b) a semiconductor circuit defined in said active circuit processing area; and
   c) at least one secondary scribe extending from said primary circuit scribe to proximate said wafer edge, said secondary scribe extending between nonactive wafer portions of said semiconductor wafer.

5. The semiconductor wafer as specified in claim 4 wherein said primary circuit scribe defines a rectangular said active circuit processing area, and one said secondary scribe extends from at least one said corner of said active circuit processing area and being collinear with one side of said active circuit processing area.

6. The semiconductor wafer as specified in claim 4 wherein said primary circuit scribe forms a grid about a plurality of said active circuit processing areas, and said secondary scribes extend from the outermost corners of said grid to said wafer edge.

7. The semiconductor wafer as specified in claim 4 wherein said semiconductor circuit comprises a micromechanical device.

8. The method as specified in claim 1, further comprising the step of forming a micromechanical device as said semiconductor circuit.

* * * * *

UNITED STATES PATENT AND TRADEMARK OFFICE
CERTIFICATE OF CORRECTION

PATENT NO.   : 5,668,062
DATED        : September 16, 1997
INVENTOR(S)  : Dae-Jin Hyun, James L. Conner It is certified that error appears in the above-indentified patent and that said Letters Patent is hereby corrected as shown below:

Cover Page, Col. 1, line [75]  Inventors, change      "Dae-Jin Hyun, Dallas; James L. Connor, Rowlett, both of Tex."

to      --Dae-Jin Hyun, Dallas; James L. Conner, Rowlett, both of Tex.--

Signed and Sealed this

Tenth Day of March, 1998

Attest:

BRUCE LEHMAN

Attesting Officer      Commissioner of Patents and Trademarks